(12) United States Patent
Bae et al.

(10) Patent No.: US 11,507,839 B2
(45) Date of Patent: Nov. 22, 2022

(54) ARTIFICIAL NEURAL NETWORK SYSTEM USING A PIECEWISE LINEAR RECTIFIER UNIT FOR COMPENSATING COMPONENT DEFECTS

(71) Applicant: UNIVERSITY-INDUSTRY COOPERATION GROUP OF KYUNG HEE UNIVERSITY, Yongin-si (KR)

(72) Inventors: Sung-Ho Bae, Daejeon (KR); Sungyoung Lee, Seongnam-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 606 days.

(21) Appl. No.: 16/590,029

(22) Filed: Oct. 1, 2019

(65) Prior Publication Data

US 2020/0034714 A1 Jan. 30, 2020

Related U.S. Application Data

(63) Continuation of application No. PCT/KR2019/003765, filed on Apr. 1, 2019.

(30) Foreign Application Priority Data

Apr. 11, 2018 (KR) .................. 10-2018-0042350

(51) Int. Cl.
*G06F 16/00* (2019.01)
*G06N 3/08* (2006.01)
(Continued)

(52) U.S. Cl.
CPC ............. *G06N 3/084* (2013.01); *G06F 30/27* (2020.01); *G06K 9/6267* (2013.01); *G06N 3/0481* (2013.01)

(58) Field of Classification Search
CPC ....................................................... G06F 30/27
See application file for complete search history.

(56) References Cited

U.S. PATENT DOCUMENTS

2019/0042922 A1\* 2/2019 Pillai ................. G06F 17/17

FOREIGN PATENT DOCUMENTS

| KR | 10-2016-0063965 A | 6/2016 |
|---|---|---|
| KR | 10-2017-0136357 A | 12/2017 |
| KR | 10-2018-0027972 A | 3/2018 |

OTHER PUBLICATIONS

International Search Report issued in PCT/KR2019/003765; dated Jul. 9, 2019.

(Continued)

*Primary Examiner* — Ajith Jacob
(74) *Attorney, Agent, or Firm* — Studebaker & Brackett PC

(57) ABSTRACT

An artificial neural network system of the present invention can include an input layer that receives input data; an output layer that outputs output data corresponding to the input data; and a hidden layer group including a multiple number of hidden layers that are positioned between the input layer and the output layer and are connected by connection weights, with the connection weights updated based on a difference between the output data and prediction data corresponding to the input data, where each of the hidden layers can include a hidden node that includes an activation function, which can output 0 if the input value is negative and can determine the output value based on linear functions having different slopes according to the range of the input value if the input value is positive, and the linear functions can have smaller slopes for greater distances from the origin point.

11 Claims, 6 Drawing Sheets

(51) Int. Cl.
*G06K 9/62* (2022.01)
*G06N 3/04* (2006.01)
*G06F 30/27* (2020.01)

(56) References Cited

OTHER PUBLICATIONS

Yoon-Hwan Cho et al.; "Study on the Activation Functions for Efficient Learning in DNN"; The Institute of Electronics and Information Engineers; Nov. 2016; pp. 800-803.

Xiaojie Jin et al.; "Deep Learning with S-shaped Rectifed Linear Activation Units"; AAAI '16 Proceedings of the Thirtieth AAAI Conference on Artificial Intelligence; Feb. 12-17, 2016; pp. 1737-1743; Phoenix, AZ, USA.

\* cited by examiner

AF2

$$g(x) = \begin{cases} 0, & x < 0 \\ px, & a > x \geq 0 \\ qx + a(p-q), & x \geq a \end{cases}$$

ARTIFICIAL NEURAL NETWORK SYSTEM USING A PIECEWISE LINEAR RECTIFIER UNIT FOR COMPENSATING COMPONENT DEFECTS

CROSS-REFERENCE TO RELATED APPLICATIONS

The present application is a continuation of International Patent Application No. PCT/KR2019/003765, filed Apr. 1, 2019, which is based upon and claims the benefit of priority to Korean Patent Application No. 10-2018-0042350, filed with the Korean Intellectual Property Office on Apr. 11, 2018. The disclosures of the above-listed applications are hereby incorporated by reference herein in their entirety.

BACKGROUND

1. Technical Field

The present invention relates to an artificial neural network system, more particularly to an artificial neural network system using a piecewise linear rectifier unit for compensating component defects.

2. Description of the Related Art

An artificial neural network relates to a computation system that imitates the human brain, as opposed to the von Neumann type computer structure that relies on logic formulas and is operated by a program. The differences that the human brain has from a computer can be mainly summarized to two points. The first is that computations are performed in a massively distributed and parallel form, and the second is that problems are solved by way of learning instead of a program developed beforehand to handle the problem. The computation system that mimics these properties of the human brain is embodied in the artificial neural network.

The development of the hardware artificial neural network occurred at around the time the digital computer based on the von Neumann computer was developed. In other words, the artificial neural network computer was not developed to replace the existing von Neumann type computer but is of a type different from the von Neumann computer, borne of an effort to imitate the structure of the human brain. The first hardware implementation of the artificial neural network computer was the MARK I Perceptron, developed in 1958 by F. Rosenblatt. The artificial neural network underwent advances and setbacks in the following 40 years, but whereas the digital computer experienced rapid advances with the advent of the IC, the artificial neural network computer did not experience sufficient developments to allow application to generalized problems.

The artificial neural network in its initial stages was mostly provided by analog technology. Generally, an analog artificial neural network has the advantage that a logical artificial neural network can be implemented in an intuitive manner, and by not using a multiplier in applying weights, a very high-speed parallel structure can be obtained that occupies only a small area. However, there are also its drawbacks in that its versatility is greatly limited, there are difficulties in saving the weight values obtained by the learning, a high sensitivity to electrical noise and temperature increases the error rate, and there are difficulties in providing an interface with a conventional digital computer. Due to these drawbacks, the analog artificial neural network was not successful as a commercial product. While there was a somewhat stagnant trend in the development of the artificial neural network up to the mid 90's, dramatic advances in digital semiconductor technology in the late 90's have rekindled research in the artificial neural network chip. Developments in ASIC technology and the advent of the FPGA have enabled the implementation of a quick and highly integrated digital VLSI, and with the development of the artificial neural network chip using such VLSI, active developments in the commercial artificial neural network chip have also been under way. Furthermore, the development of the high-speed DSP has enabled the implementation of an artificial neural network using a parallel DSP. Although there are drawbacks compared to the analog artificial neural network chip, such as a larger occupied area and a slower speed for example, there are also several advantages in that the weight values can be readily saved, the manufacture can be performed more easily using conventional digital processor technology, and the structure can have a comparatively higher degree of freedom compared to the analog artificial neural network.

Methods of implementing a digital artificial neural network can largely be divided into two types. The first is to implement the artificial neural network based on a microprocessor using a DSP or CPU, and the second is to implement the artificial neural network by directly forming a circuit of synapses, neurons, etc., in an ASIC form. The digital processor-based artificial neural network carries the advantages that the area is smaller compared to the number of synapses implemented, the design is easier due to the use of a conventional processor, and the artificial neural network can be implemented in various forms simply by modifying the program. However, compared to the artificial neural network implemented with an ASIC, there is difficulty in forming a single chip, and the efficiency levels of parallel processing and distributed processing, which are arguably the main features of the neural network, are lower. Using ASIC technology for implementing an artificial neural network provides the advantages that the artificial neural network can be implemented in various forms according to its purpose and that the artificial neural network can be implemented in a form close to the theoretical model, but there are also drawbacks in that, once implemented, the neural network is difficult to modify or expand.

In a neural network having a typical fully connected form, an increase in neurons can cause a quadratic increase in the number of synapses, and the amount of multipliers increases proportionally. The occupied area and reduced speed resulting from such increase in multipliers pose greater problems in the digital artificial neural network than in the analog artificial neural network which does not use multipliers, and to overcome these problems, researchers have sought ways to reduce the size of multipliers while keeping the structure unchanged, such as the digital neural network that does not include multipliers or the digital neural network adopting a serial data system for reducing the size of the multipliers. There have also been studies on other methods aimed at resolving the problem of the increase in multipliers resulting from an increase in neurons and synapses by implementing the existing fully connected structure as a modular architecture instead of in a physical form, where examples may include the digital neural network that reuses multipliers by way of a bus architecture such as of a SIMD form, the artificial neural network that adopts a systolic array architecture to linearly increase the number of multipliers, and the neural network that uses neighborhood connections as in a cellular neural network.

Currently, most artificial neural networks are being implemented by utilizing the CMOS (complementary metal-oxide semiconductor). However, in order to implement a high-integration, low-power deep-learning structure as commercial hardware, it is anticipated that the use of a new component (for instance, ReRAM) for replacing the CMOS is needed. However, high-integration, low-power components can retrieve distorted values during a read operation due to the channel interference phenomenon and due to their multi-layered structure. Thus, there is a need for a method that can compensate for such errors in these components.

SUMMARY

An objective of the invention is to provide an artificial neural network system that employs a modified activation function to compensate for distortions caused by component errors.

An artificial neural network system according to an embodiment of the present invention can include an input layer configured to receive input data; an output layer configured to output output data corresponding to the input data; and a hidden layer group including a multiple number of hidden layers that are positioned between the input layer and the output layer and are connected by connection weights, with the connection weights updated based on a difference between the output data and prediction data corresponding to the input data, where each of the hidden layers can include a hidden node that includes an activation function, the activation function can output 0 if the input value is a negative number and can determine the output value based on linear functions having different slopes according to the range of the input value if the input value is a positive number, and the linear functions can have smaller slopes for greater distances from the origin point.

In one embodiment, the activation function can be defined by the formula shown below, where the input value can be classified based on the origin point and a first parameter (a), the activation function having a first slope (p) in a first section between the origin point and the first parameter (a) and a second slope (q) in a second section greater than the first parameter (a), and the second slope (q) being smaller than the first slope (p).

$$g(x) = \begin{cases} 0, & x < 0 \\ px, & a > x \geq 0 \\ qx + a(p-q), & x \geq a \end{cases}$$

In one embodiment, the first parameter (a) can be sequentially increased starting from the origin point and can be determined as the value yielding a minimum difference between the output data and the prediction data.

In one embodiment, the first slope (p) and the second slope (q) can be determined by using a gradient descent method during error back propagation learning.

In one embodiment, the activation function can be defined by the formula shown below, where the input value can be classified based on the origin point, a first parameter (a), and a second parameter (b), with the activation function having a first slope (p) in a first section between the origin point and the first parameter (a), a second slope (q) in a second section between the first parameter (a) and a second parameter (b), and a third slope (r) in a third section greater than the second parameter (b), and where the third slope (r) can be smaller than the second slope (q), and the second slope (q) can be smaller than the first slope (p).

$$h(x) = \begin{cases} 0, & x < 0 \\ px, & a > x \geq 0 \\ qx + a(p-q), & b > x \geq a \\ rx + a(p-q) + b(q-r), & x \geq b \end{cases}$$

In one embodiment, the first parameter (a) can be sequentially increased starting from the origin point and can be determined as the value yielding a minimum difference between the output data and the prediction data.

In one embodiment, the second parameter (b) can be sequentially increased starting from the first parameter (a) and can be determined as the value yielding a minimum difference between the output data and the prediction data.

In one embodiment, the first slope (p), second slope (q), and third slope (r) can be determined by using a gradient descent method during error back propagation learning.

An artificial neural network system according to an embodiment of the present invention can include at least one input node configured to receive input data; at least one output node configured to output output data corresponding to the input data; and a multiple number of hidden nodes positioned between the input node and the output node, where the hidden nodes can be connected by connection weights, the connection weights can be updated based on a difference between the output data and prediction data corresponding to the input data, each of the hidden nodes can include an activation function configured to control an output range of the node, the activation function can partition a range of an input value by way of a multiple number of parameters and can determine the output value based on linear functions having different slopes in partitioned sections, with the linear functions having smaller slopes for greater distances from the origin point.

In one embodiment, the parameters can be determined as values yielding a minimum difference between the output data and the prediction data.

In one embodiment, the slope of each of the linear functions can be determined by using a gradient descent method during error back propagation learning.

An embodiment of the invention can provide an artificial neural network system that uses a modified activation function to compensate for distortions caused by component errors.

DETAILED DESCRIPTION

Figure 1:
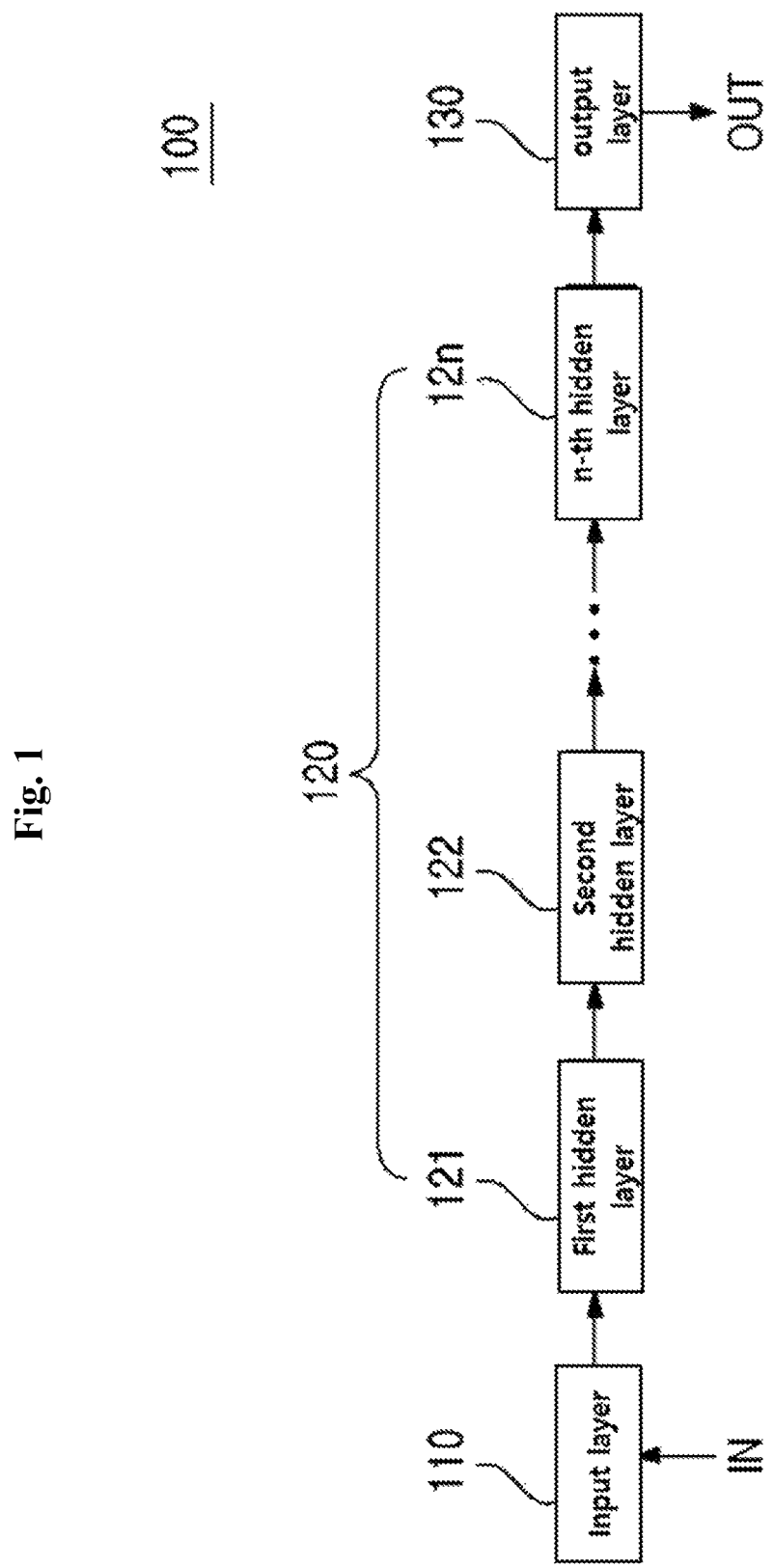
FIG. 1 is a block diagram illustrating an artificial neural network system according to an embodiment of the present invention.

It is to be appreciated that the general description above and the detailed description below are provided only for illustrative purposes as descriptions that elaborate on the invention set forth in the claims. Reference numerals are assigned in relation to the preferred embodiments of the present invention, and examples are shown in the drawings. The same reference numerals are used in the descriptions and the drawings to refer to the same or similar parts as much as possible.

Figure 2:
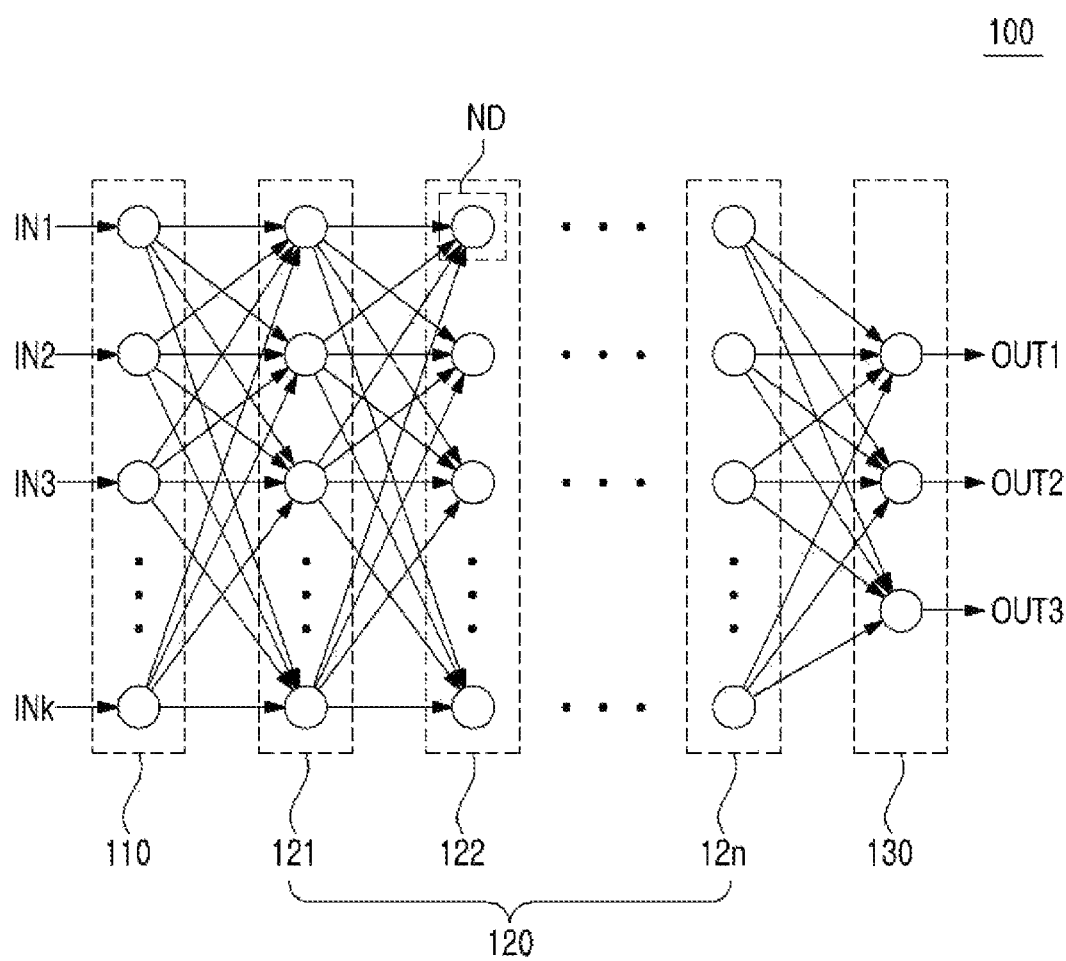
FIG. 2 is a diagram providing a more detailed view of the artificial neural network system shown in FIG. 1.

FIG. 1 is a block diagram illustrating an artificial neural network according to an embodiment of the present invention. FIG. 2 is a diagram providing a more detailed view of the artificial neural network shown in FIG. 1. Referring to FIG. 1 and FIG. 2, the artificial neural network system 100 can include an input layer 110, a multiple number of hidden layers 120, and an output layer 130. The artificial neural network system 100 can be implemented as software or hardware that imitates the computation capabilities of a biological system by using multiple artificial neurons connected with connection lines.

The artificial neural network system 100 can provide an output (OUT) corresponding to an input (IN). For example, an input (IN) can include voice data, image data, biometric data, handwriting data, etc. The artificial neural network system 100 can recognize what sentence (or word) is conveyed by the inputted voice data or recognize who the person shown in the video clip is. Also, the artificial neural network system 100 can recognize the biometric status of a user by analyzing a biometric signal such as an ECG (electrocardiogram), an EEG (electroencephalogram), etc., or recognize an inputted handwriting by analyzing the action of a user. The artificial neural network system 100 can also be used with a DNA (deoxyribonucleic acid) sequencing device to estimate the correct DNA sequence from an observed signal. That is, the output (OUT) can be the recognition result for the inputted data.

The artificial neural network system 100 can include multiple layers. For example, the input layer 110 can receive an input (IN) for learning and transfer the input to a multiple number of hidden layers 120. The multiple hidden layers 120 can include a first hidden layer 121 to an n-th hidden layer 12n. The multiple hidden layers 120 can modify the learning data transferred via the input layer 110 into values that are easier to predict. Each of the hidden layers 121-12n can transfer the input value received from a previous hidden layer to a subsequent hidden layer based on a particular criterion, where each hidden layer can apply a different connection weight when transferring the value. The output layer 130 can generate an output (OUT) based on the signal received from the multiple number of hidden layers 120. In the input layer 110, the hidden layers 121-12n, and the output layer 130, there may be no direct connection within each layer, and may be only connections between each layer.

That is, the artificial neural network system 100 can use artificial neurons having simplified functions of biological neurons, where these artificial neurons can be interconnected via connection lines having connection weights. A connection weight is a particular value that a connection line has and can also be referred to as a connection strength. An artificial neuron can be referred to as a node.

Each of the input layer 110, the hidden layers 121-12n, and the output layer 130 can include multiple nodes. For example, the input layer 110 can include a multiple number of input nodes. Each hidden layer 121-12n can include a multiple number of hidden nodes. The output layer 130 can include a multiple number of output nodes. The number of nodes included in each layer (i.e. the input layer, hidden layers, and output layer) can be different. The input nodes can receive input values IN1~INk, respectively. That is, one node can be inputted with one input value. The output nodes can output their respective output values OUT1~OUT3. That is, one output node can output one output value. A connection weight can be applied between one node and a subsequent node. The connection weight can be determined individually between nodes. A connection weight can be updated through learning and error back propagation.

The artificial neural network system 100 can include a multiple number of hidden layers 120. An artificial neural network that includes multiple hidden layers 120 is known as a DNN (deep neural network), and learning for the DNN is known as deep learning. A node included in a hidden layer is referred to as a hidden node. The output of a hidden node in a previous time section can be connected to hidden nodes in a current time section. Also, the output of a hidden node in the current time section can be connected to hidden nodes of a subsequent time section. An artificial neural network having recurrent connections between hidden nodes of different time sections is known as a RNN (recurrent neural network).

The artificial neural network system 100 can provide learning for a neural network through supervised learning. Supervised learning is a method of inputting the learning data together with the corresponding output data into a neural network and updating the connection weights of the connection lines such that the output data corresponding to the learning data is outputted. For example, the artificial neural network system 100 can update the connection weights between the artificial neurons based on the Delta rule, error back propagation learning, etc.

Error back propagation learning is a method that involves estimating error with forward computation for a given set of learning data, propagating the estimated error in a backward direction starting from the output layer towards the hidden layer and input layer, and updating the connection weights to reduce the error. For example, error back propagation learning can be divided into a step of transferring an input (IN) across each layer to compute the output (OUT) and a step of modifying the connection weights within the neural network so as to reduce the error of the output (OUT).

The artificial neural network system 100 can define an objective function for measuring how close the currently configured connection weights are to the optimal values, continuously modifying the connection weights based on the results of the objective function, and repeating the learning in an iterative manner. For example, the objective function can be an error function with which the neural network computes the error between an actually outputted output value and the desired expectation value based on the learning data. The artificial neural network system 100 can update the connection weights such that the result of the error function is decreased.

An example of a method for updating the connection weights is the gradient descent method. The gradient descent method refers to updating the connection weights towards decreasing the change in the error (i.e. slope) in relation to the change in the connection weight of each node. Since an artificial neural network is composed of a multiple number of layers, the connection weight of each node is one of several connection weights multiplied to a signal. Therefore, this relationship can be expressed as Equation 1 due to the chain rule of calculus. Here, Error refers to the error, weight refers to the connection weight, and activation refers to the activation function.

$$\frac{dError}{dweight} = \frac{dError}{dactivation} * \frac{dactivation}{dweight} \quad \text{[Equation 1]}$$

Figure 3:
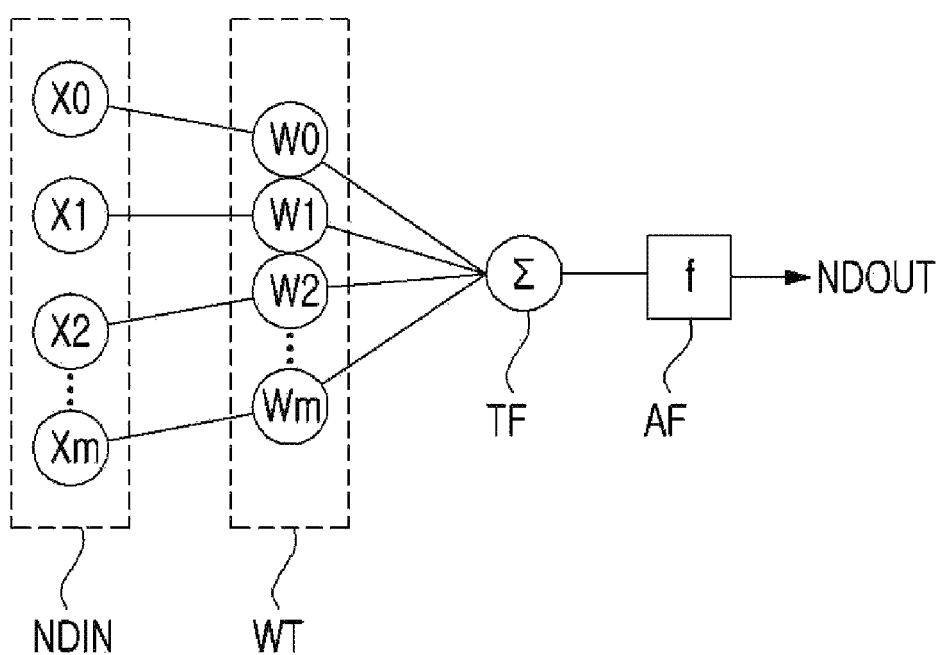
FIG. 3 is a diagram illustrating a hidden node of FIG. 2.

FIG. 3 is a diagram illustrating a hidden node of FIG. 2. Referring to FIG. 3, the node (ND) can receive node inputs (NDIN). The node inputs (NDIN) can include input values X0~Xm. The input values X0~Xm can be received from the nodes of a previous hidden layer. The input values X0~Xm can respectively be multiplied with connection weights W0~Wm. The weights W0~Wm can be in one-to-one correspondence with the connection lines of the nodes of the previous hidden layer. The products of the respective input values X0~Xm and the respective connection weights W0~Wm can be summed by a transfer function (TF). The activation function (AF) can limit the range of the output value of the transfer function (TF) to output the node output (NOUT).

The activation function (AF) can limit the range of the output value of the transfer function (TF) and allow convenient computations. Thus, depending on what activation function (AF) is used, the learning efficiency of the artificial neural network system 100 can vary.

Figure 4:
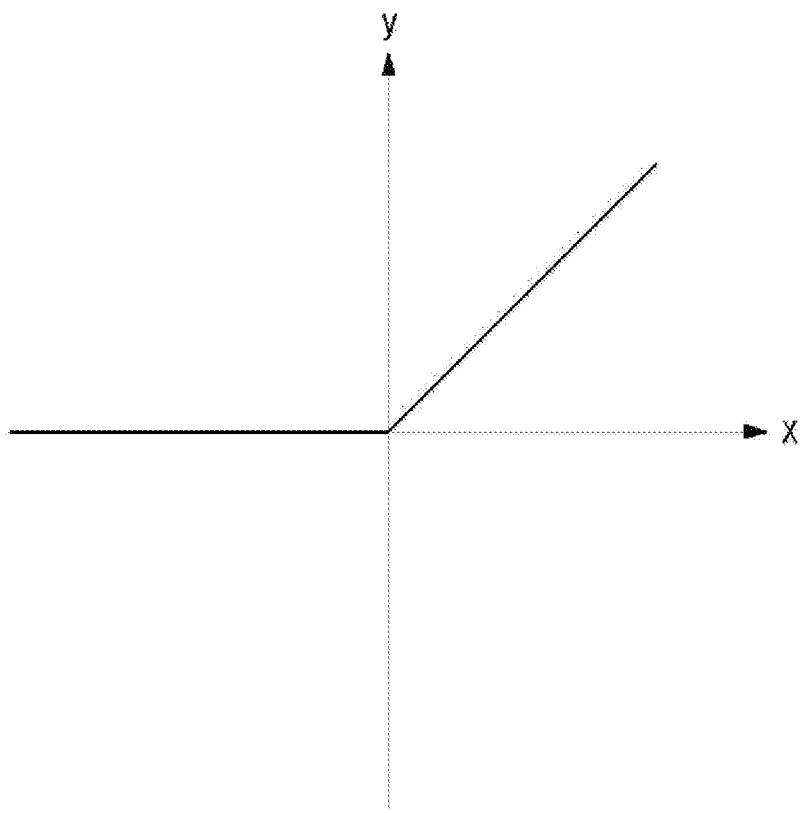
FIG. 4 is a diagram illustrating a ReLU (rectified linear unit), which is a typical activation function.

FIG. 4 is a diagram illustrating a ReLU (rectified linear unit), which is a typical activation function. Referring to FIG. 4, the ReLU can output 0 if the input value (i.e. the output of the transfer function) is smaller than 0 and output the input value as is if the input value is greater than or equal to 0.

The ReLU was designed to resolve the problems of the conventional sigmoid function. When a sigmoid function is used as the activation function, a 'vanishing gradient' phenomenon occurred, in which learning was not properly performed for an increased number of hidden layers. The reason for this phenomenon is that, since a sigmoid function is a function that yields a value of 0-1 as the output value, the greater the number of hidden layers, the more the result of multiplying the differential value draws closer to 0, so that the error fails to undergo backward propagation up to the input layer. The ReLU was designed to resolve this problem. However, the high-integration low-power components used in recent artificial neural network systems 100 are vulnerable to component errors due to the channel interference phenomenon and an unstable multilayer structure, and as a result, a very high transfer function output value can be generated in the hidden layers. Thus, there is a need for an activation function that can reduce the error back propagation phenomenon associated with component errors.

Figure 5:
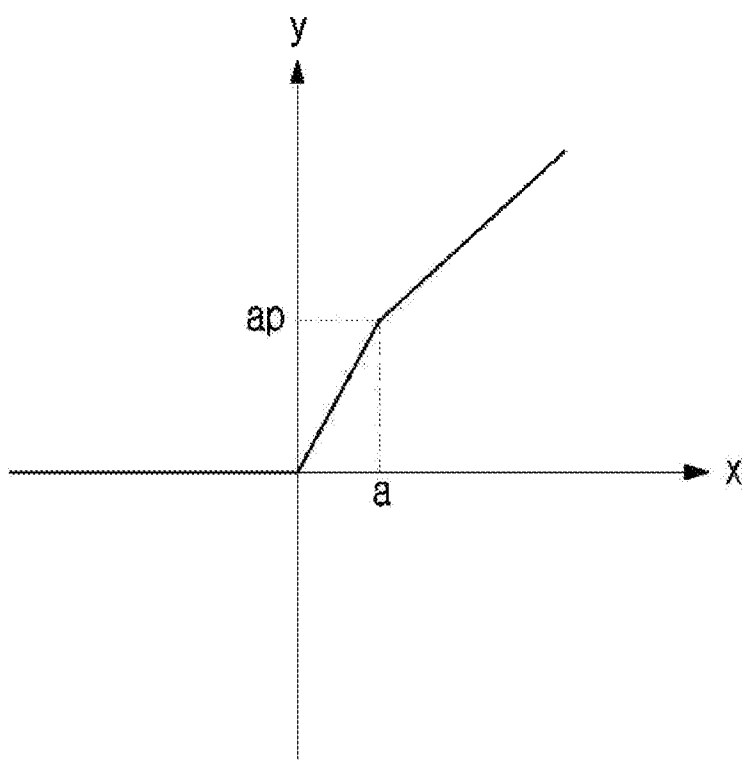
FIG. 5 is a diagram illustrating an activation function according to an embodiment of the present invention.

FIG. 5 is a diagram illustrating an activation function according to an embodiment of the present invention. Referring to FIG. 5, the activation function (AF2) can be defined as a sectionalized linear function having different slopes (p, q) in two sections when the input value (x) is greater than 0, as shown in Equation 2. In the following, this sectionalized linear function is referred to as a PLRU (piecewise linear rectification unit).

$$g(x) = \begin{cases} 0, & x < 0 \\ px, & a > x \geq 0 \\ qx + a(p-q), & x \geq a \end{cases} \quad \text{[Equation 2]}$$

When the input value (x) is a negative number, the activation function (AF2) can output 0. When the input value (x) is greater than or equal to 0 but smaller than a first parameter (a), the activation function (AF2) can output an output value (y) according to a straight line that has a first slope (p) as its slope and passes through the origin point. When the input value (x) is greater than the first parameter (a), the activation function (AF2) can output an output value (y) according to a straight line that has a second slope (q) as its slope and passes through the point [a, ap]. The second slope (q) can be determined as a value smaller than the first slope (p). Thus, even if a very high input value is transferred due to a component error, the activation function (AF2) can limit the range of the output value (y). The first parameter (a) can be determined by repeating the learning of the artificial neural network system 100 with the value increased from 0 in a stepwise manner and selecting the point at which the error is minimized. The first slope (p) and the second slope (q) can be determined by using the gradient descent method during the error back propagation learning after the first parameter (a) is determined.

An artificial neural network system 100 based on an embodiment of the present invention can use a piecewise linear rectification unit (PLRU), in which the slope is decreased in each section as described above with reference to FIG. 5, as the activation function. Therefore, even if there is a hidden node that transfers a very large value due to a component error, the artificial neural network system 100 can reduce error propagation with the activation function.

Figure 6:
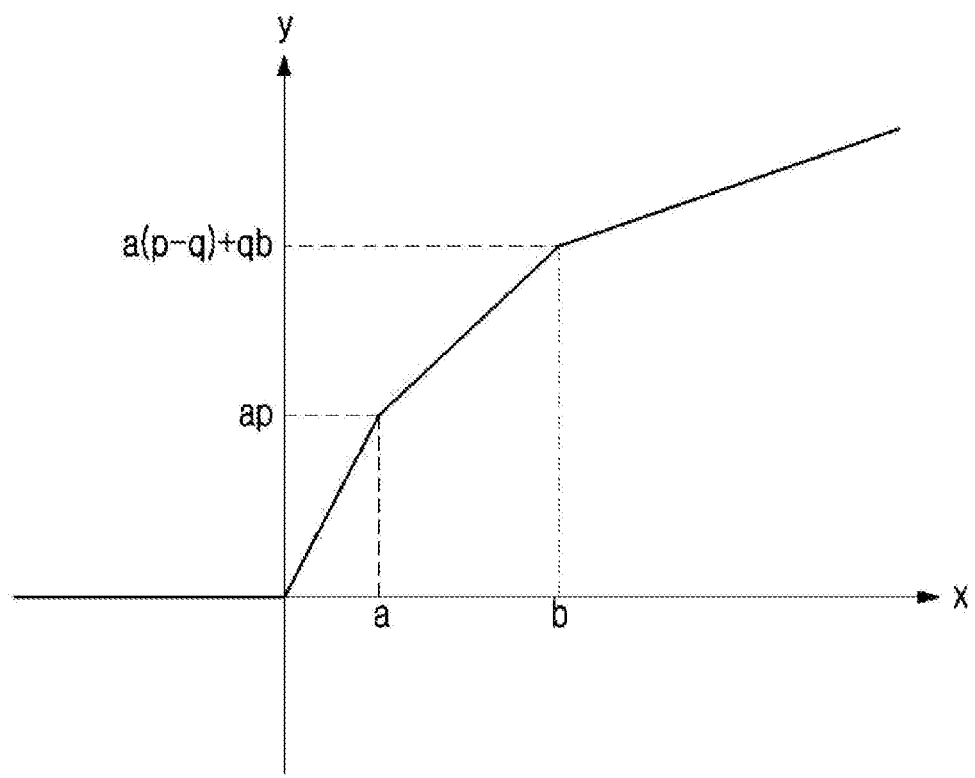
FIG. 6 is a diagram illustrating an activation function according to another embodiment of the present invention.

FIG. 6 is a diagram illustrating an activation function according to another embodiment of the present invention. Referring to FIG. 6, the activation function (AF3) can be defined as a piecewise linear rectification unit (PLRU) that has different slopes in three sections for cases in which the input value (x) is greater than 0, as represented below in Equation 3.

$$h(x) = \begin{cases} 0, & x < 0 \\ px, & a > x \geq 0 \\ qx + a(p-q), & b > x \geq a \\ rx + a(p-q) + b(q-r), & x \geq b \end{cases} \quad \text{[Equation 3]}$$

When the input value (x) is a negative number, the activation function (AF3) can output 0. When the input value (x) is greater than or equal to 0 and smaller than a first parameter (a), the activation function (AF3) can output an output value (y) according to a straight line that has a first slope (p) as its slope and passes through the origin point. When the input value (x) is greater than or equal to the first parameter (a) and smaller than a second parameter (b), the activation function (AF3) can output an output value (y) according to a straight line that has a second slope (q) as its slope and passes through the point [a, ap]. When the input value (x) is greater than the second parameter (b), the activation function (AF3) can output an output value (y) according to a straight line that has a third slope (r) as its slope and passes through the point [b, a(p−q)+qb].

The second slope (q) can be determined as a value smaller than the first slope (p). Also, the third slope (r) can be determined as a value smaller than the second slope (q). Thus, even if a very high input value is transferred due to a component error, the activation function (AF3) can limit the range of the output value (y). The first parameter (a) can be determined by repeating the learning of the artificial neural network system 100 with the value increased from 0 in a stepwise manner and selecting the point at which the error is minimized. The second parameter (b) can be determined by repeating the learning of the artificial neural network system 100 with the value increased from the first parameter (a) in a stepwise manner and selecting the point at which the error is minimized. The first slope (p), second slope (q), and third slope (r) can be determined by using the gradient descent method during the error back propagation learning after the first parameter (a) and second parameter (b) are determined.

An artificial neural network system 100 based on an embodiment of the present invention can use a piecewise linear rectification unit (PLRU), in which the slope is decreased in each section as described above with reference to FIG. 6, as the activation function. Therefore, even if there is a hidden node that transfers a very large value due to a component error, the artificial neural network system 100 can reduce error propagation with the activation function. The PLRU of FIG. 6 can further reduce error propagation compared to the PLRU of FIG. 5.

The piecewise linear rectification unit (PLRU) is not limited to the examples described with reference to FIG. 5 and FIG. 6 and can have the input value (x) classified into a multiple number of (four or more) sections for the range greater than 0, with each section associated with a linear function. The linear function of each section can pass through the same point at the section boundary. The slopes of the linear functions in the respective sections can be smaller, the further they are from the origin point.

An embodiment of the present invention is provided in the drawings and the specification, as set forth above. The specific terms used herein are intended for the purpose of illustrating the present invention only and are intended neither to limit the meaning of the term nor to limit the scope of the present invention. Therefore, a person having ordinary skill in the art would understand that various modifications and equivalent embodiments can be derived from the disclosure of the present invention. Thus, the true scope of protection of the present invention must be defined by the technical spirit conveyed in the appended scope of claims.

What is claimed is:

1. An artificial neural network system comprising:
a hardware processor configured to implement:
an input layer configured to receive input data;
an output layer configured to output output data corresponding to the input data; and
a hidden layer group including a plurality of hidden layers, the hidden layers positioned between the input layer and the output layer, the hidden layers connected by connection weights, the connection weights updated based on a difference between the output data and prediction data corresponding to the input data,
wherein each of the hidden layers includes a hidden node, the hidden node including an activation function,
the activation function outputs 0 if an input value is a negative number, the activation function determines an output value based on linear functions having different slopes according to a range of the input value if the input value is a positive number, and
the linear functions have smaller slopes for greater distances from an origin point.

2. The artificial neural network system of claim 1, wherein the activation function is defined by a formula shown below, the input value is classified based on the origin point and a first parameter (a), the activation function has a first slope (p) in a first section between the origin point and the first parameter (a) and a second slope (q) in a second section greater than the first parameter (a), and the second slope (q) is smaller than the first slope (p), $$g(x) = \begin{cases} 0, & x < 0 \\ px, & a > x \geq 0 \\ qx + a(p-q), & x \geq a \end{cases}.$$

3. The artificial neural network system of claim 2, wherein the first parameter (a) is sequentially increased starting from the origin point and is determined as a value yielding a minimum difference between the output data and the prediction data.

4. The artificial neural network system of claim 3, wherein the first slope (p) and the second slope (q) are determined by using a gradient descent method during error back propagation learning.

5. The artificial neural network system of claim 1, wherein the activation function is defined by a formula shown below,
the input value is classified based on the origin point, a first parameter (a), and a second parameter (b),
the activation function has a first slope (p) in a first section between the origin point and the first parameter (a), a second slope (q) in a second section between the first parameter (a) and a second parameter (b), and a third slope (r) in a third section greater than the second parameter (b), and the third slope (r) is smaller than the second slope (q), and the second slope (q) is smaller than the first slope (p), $$h(x) = \begin{cases} 0, & x < 0 \\ px, & a > x \geq 0 \\ qx + a(p-q), & b > x \geq a \\ rx + a(p-q) + b(q-r), & x \geq b \end{cases}.$$

6. The artificial neural network system of claim 5, wherein the first parameter (a) is sequentially increased starting from the origin point and is determined as a value yielding a minimum difference between the output data and the prediction data.

7. The artificial neural network system of claim 6, wherein the second parameter (b) is sequentially increased starting from the first parameter (a) and is determined as a value yielding a minimum difference between the output data and the prediction data.

8. The artificial neural network system of claim 7, wherein the first slope (p), the second slope (q), and the third slope (r) are determined by using a gradient descent method during error back propagation learning.

9. An artificial neural network system comprising:
a hardware processor configured to implement:
at least one input node configured to receive input data;
at least one output node configured to output output data corresponding to the input data; and
a plurality of hidden nodes positioned between the input node and the output node,
wherein the hidden nodes are connected by connection weights, the connection weights are updated based on a difference between the output data and prediction data corresponding to the input data, each of the hidden nodes includes an activation function configured to control an output range of the node,
the activation function partitions a range of an input value by way of a plurality of parameters and determines an output value based on linear functions having different slopes in partitioned sections, the linear functions have smaller slopes for greater distances from an origin point.

10. The artificial neural network system of claim 9, wherein the parameters are determined as values yielding a minimum difference between the output data and the prediction data.

11. The artificial neural network system of claim 10, wherein a slope of each of the linear functions is determined by using a gradient descent method during error back propagation learning.

* * * * *